United States Patent [19]

Olson et al.

[11] Patent Number: 5,142,450
[45] Date of Patent: Aug. 25, 1992

[54] NON-CONTACT LEAD DESIGN AND PACKAGE

[75] Inventors: Timothy L. Olson, Phoenix; Frank J. Mosna, Jr., Tempe, both of Ariz.

[73] Assignee: Motorola, Inc., Schaumburg, Ill.

[21] Appl. No.: 684,108

[22] Filed: Apr. 12, 1991

[51] Int. Cl.⁵ ............................................. H05K 5/02
[52] U.S. Cl. ..................................... 361/421; 361/388; 361/404; 361/405; 29/827; 437/220; 437/222
[58] Field of Search ............... 361/386, 388, 392, 400, 361/404, 405, 417, 419, 420, 421; 174/52.4; 29/827, 842, 844; 437/220, 222

[56] References Cited

U.S. PATENT DOCUMENTS 4,771,330 9/1988 Long .................................. 357/69 X
4,807,018 2/1989 Cellai ................................. 357/70

Primary Examiner—Leo P. Picard
Assistant Examiner—Paramita Ghosh
Attorney, Agent, or Firm—Eugene A. Parsons

[57] ABSTRACT

A leadframe having wire bonding zones recessed from the single plane of the upper surface. Heat actuated adhesive tape sandwiched between the leadframe and a heatspreader is heated and the assembly is pressed together to bond the heatspreader to the leadframe without contacting the wire bonding zones.

6 Claims, 4 Drawing Sheets

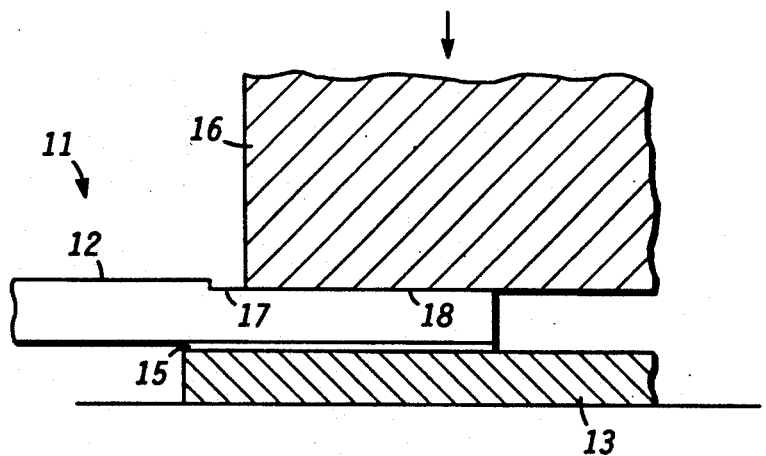
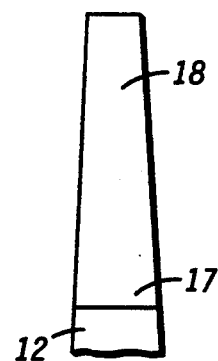
FIG. 1A
—PRIOR ART—
FIG. 1B
—PRIOR ART—
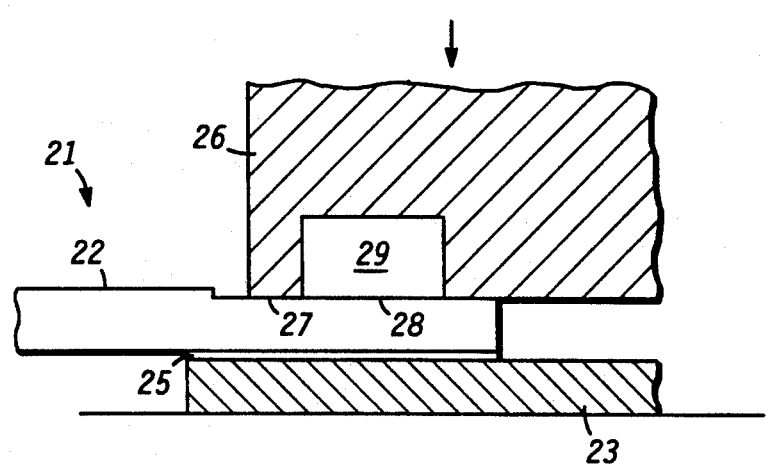
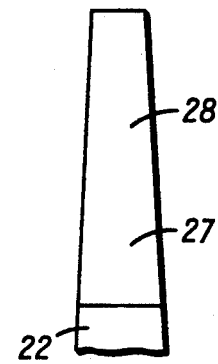
FIG. 2A
FIG. 2B
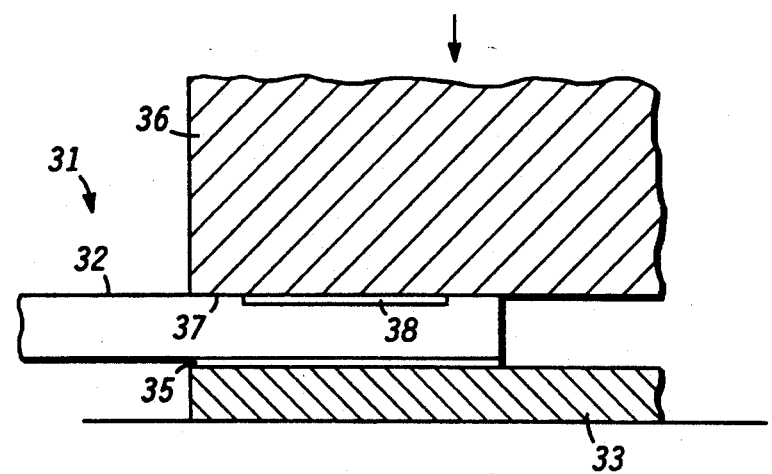
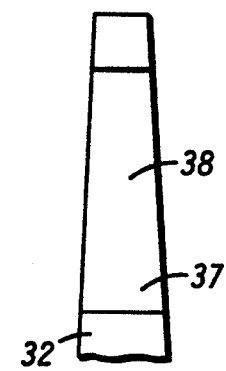
FIG. 3A
FIG. 3B

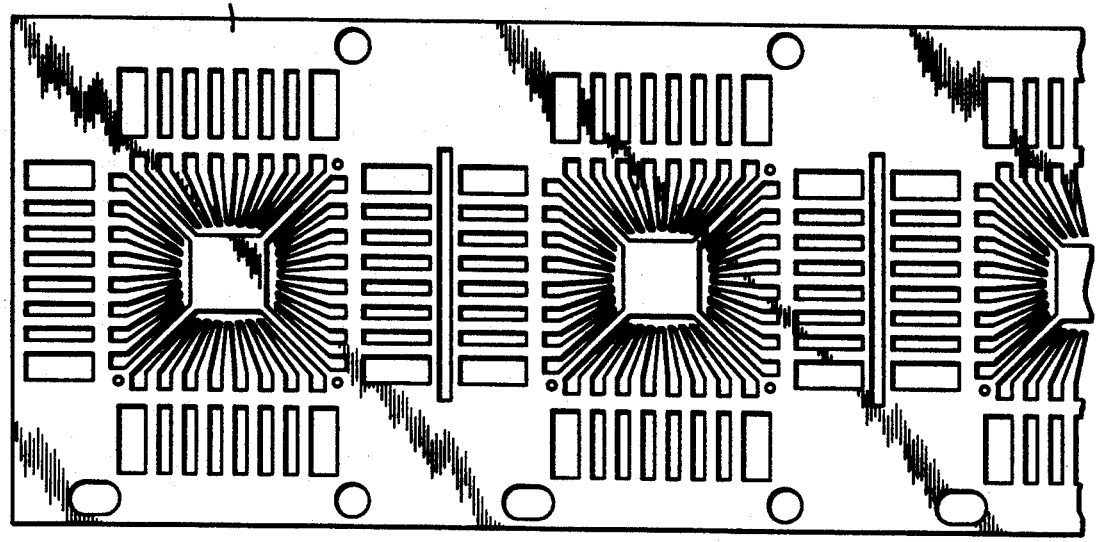
FIG. 4A
FIG. 4B
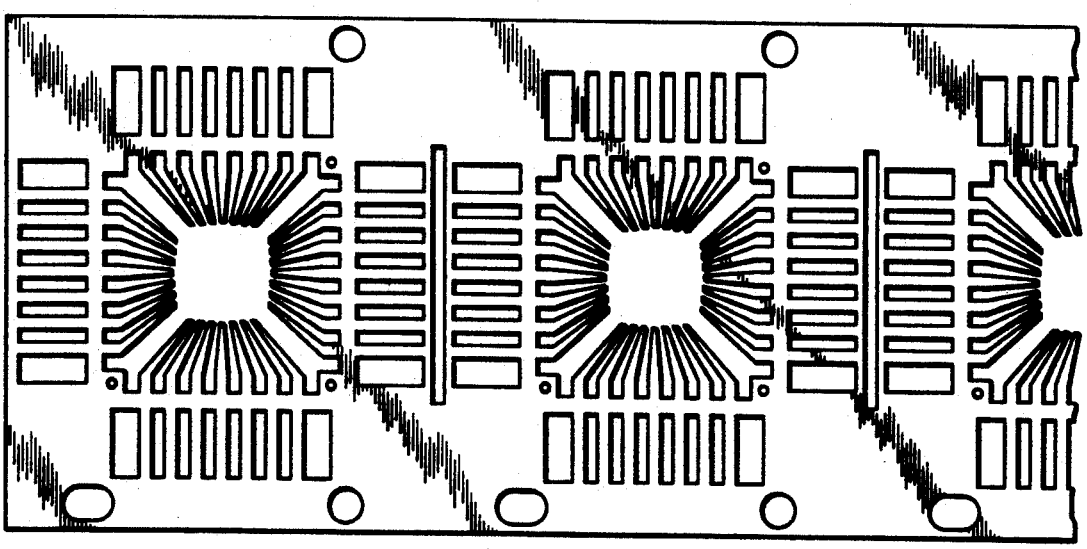

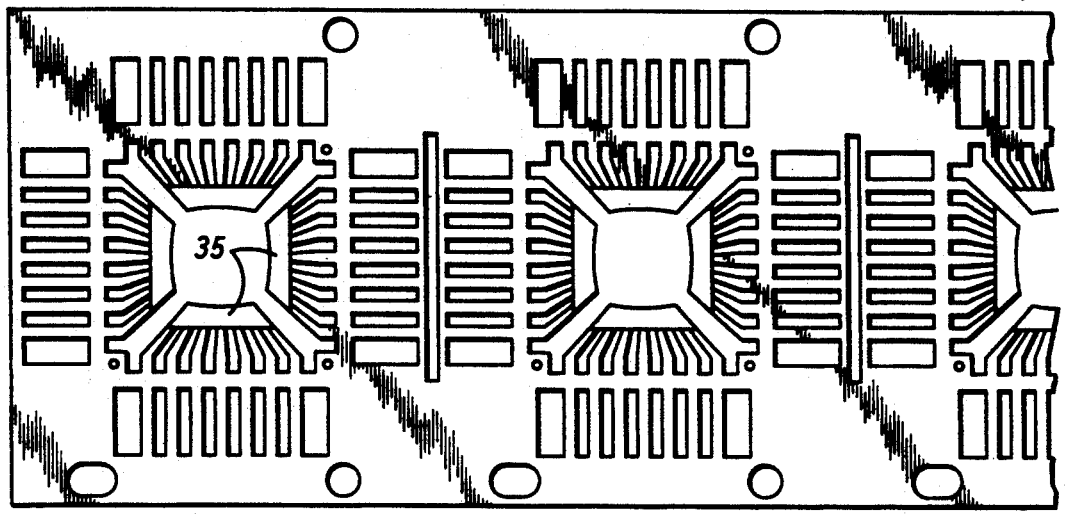
FIG. 4C
FIG. 4E
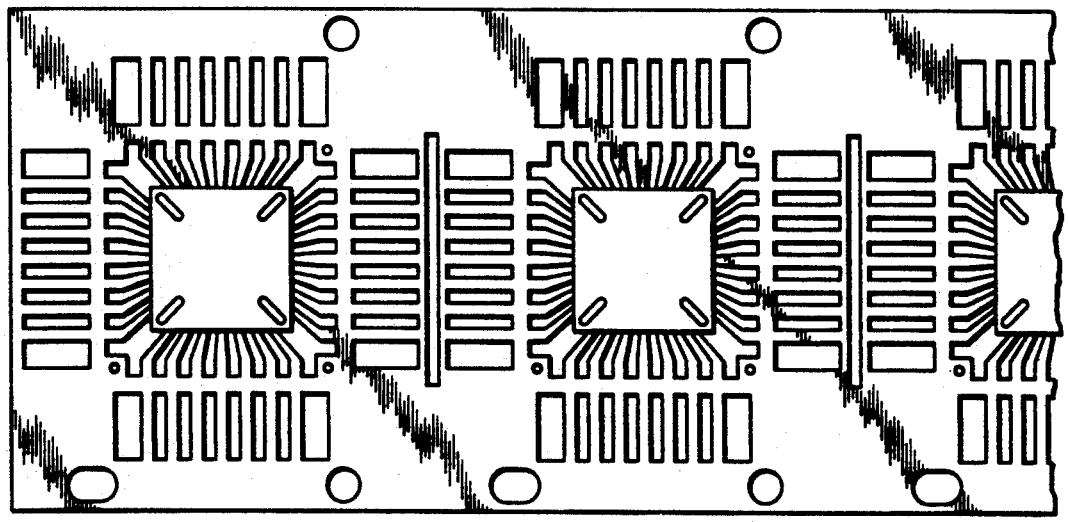

NON-CONTACT LEAD DESIGN AND PACKAGE

The present invention pertains to semiconductor packages having a plurality of leads with a heatspreader attached thereto and more specifically to specific leads and method for attaching a heatspreader thereto.

BACKGROUND OF THE INVENTION

There is a continual push in the semiconductor industry for higher power IC devices, which require thermally enhanced packages. Heatspreader type designs cost effectively fulfill this need. Presently, 28 and 52 lead PLCC heatspreader packages exist and it is anticipated that further applications for SOIC, SOJ, QFP and other PLCC heatspreader packages will be available in the near future. Further, most standard IC leadframe designs would benefit from added protection of the critical wire bond surface during handling and shipment.

In the assembly of heatspreader packages, a heatspreader is generally affixed to the leads and flag area of each leadframe by an adhesive tape. A problem arises because the heatspreader, tape and leadframe are sandwiched together and pressed into place, generally under heat to activate the adhesive in the tape. The pressure and heat is applied directly to the upper surfaces of the leadframe, which includes wire bonding zones near the tip of each lead in each leadframe. The heat and pressure on the bonding zones creates scratching, dents, and other damage as well as leaving foreign matter and other contaminates thereon. This physical damage and contamination leads to visual quality problems, as well as latent functional problems, when the semiconductor die is wired to the leadframe due to inconsistent and in some cases poor wire bonding.

SUMMARY OF THE INVENTION

The present invention is embodied in a non-contact lead design for semiconductor packages including a leadframe having wire bonding zones defined thereon for having bonded thereto one end of wires connected to a semiconductor chip, the leadframe having a surface lying substantially in a single plane and the wire bonding zones being defined in the surface and recessed from the single plane.

The invention is further embodied in a method of constructing a heatspreader and leadframe package with non-contact leads including the steps of providing a leadframe defining a semiconductor chip receiving area and including a plurality of non-contact leads each having a wire bonding zone defined thereon for having bonded thereto one end of wires connected to a semiconductor chip, the leadframe having a first surface defining the wire bonding zones and a second surface opposite and substantially parallel with the first surface, providing a dielectric tape having two opposite sides with heat activated adhesive thereon, positioning the dielectric tape adjacent the second surface of the leadframe, in underlying relationship to at least the wire bonding zones, providing a heatspreader having a substantially planar surface with an area at least coextensive with the semiconductor chip receiving area and the wire bonding zones of the leadframe, positioning the adhesive tape in overlying relationship on the heatspreader so that the semiconductor chip receiving area and wire bonding zones of the leadframe are in overlying relationship to the heatspreader and positioned on the opposite side of the adhesive tape from the heatspreader, and pressing the leadframe, adhesive tape and heatspreader together and heating the tape to form an integral unit without contacting the wire bonding zones.

BRIEF DESCRIPTION OF THE DRAWINGS

Referring to the drawings:

FIG. 1A is a sectional view of a prior art leadframe/heatspreader assembly;

FIG. 1B is a view in top plan of a single lead from the assembly of FIG. 1A, portions thereof broken away;

FIGS. 2A and 2B are views similar to FIGS. 1A and 1B of an intermediate experimental embodiment;

FIGS. 3A and 3B are views similar to FIGS. 1A and 1B of a preferred embodiment of the present invention;

FIGS. 4A through 4E illustrate the preferred embodiment of FIG. 3A in various stages of assembly.

DESCRIPTION OF THE EMBODIMENTS

Figure 4D:
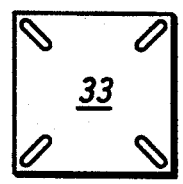

Referring specifically to FIGS. 1A and 1B, a prior art leadframe/heatspreader assembly 10 is illustrated. Assembly 10 includes a leadframe 11, partially broken away and illustrating lead 12, a heatspreader 13 and adhesive tape 15. A heat block 16 is illustrated applying heat and pressure to assembly 10. Heat block 16 engages lead 12 adjacent the end thereof at a slightly recessed area 17, which includes a wire bonding zone 18 for receiving one end of a lead wire (not shown) bonded thereto.

Generally, tape 15 is a strip of material which conducts heat but not electricity and which has a layer of heat activated adhesive on the two opposite planar sides. Tape 15 is sandwiched between leadframe 11 and heatspreader 13 so as to be coextensive with heatspreader 13 and to lie beneath the tips of leads 12 and the flag area of leadframe 11. This temporary assembly is produced in two steps. First, tape 15 is positioned on a surface with leadframe 11 in overlying position thereon. Heat block 16 is then brought into contact with recessed areas 17 of leadframe 11 to temporarily position tape 15 on leadframe 11. Heatspreader 13 is then put into position over tape 15. Heat block 16 is heated and then pressed against the recessed areas 17, including the wire bonding zones 18, to activate the adhesive on tape 15 and to firmly bond assembly 10 together.

FIG. 1A illustrates the normal contact between each of the leads 12 of leadframe 11 and heat block 16. In the normal assembly procedure explained above, heat block 16 comes into contact twice with recessed area 17 of each of leads 12. This contact causes scratches, dents and other physical defects in the recessed area 17, as well as contamination of the wire bonding zone 18 caused by excess adhesive, heat and other foreign matter that may be present. Many of these defects can be visually discerned and the leadframe/heatspreader assembly 10 rejected before further operations occur. However, many of these physical defects and contamination are not visually discernable and a wire bond in wire bonding zone 18 can be seriously impaired, leading to quality problems or bond failure in the final semiconductor package.

Referring specifically to FIGS. 2A and 2B, a leadframe/heatspreader assembly 20 is illustrated. Assembly 20 includes a leadframe 21 partially broken away and illustrating lead 22, a heatspreader 23 and adhesive tape 25. A heat block 26 is illustrated applying heat and pressure to assembly 20. Heat block 26 engages lead 22 adjacent the end thereof at a slightly recessed area 27, which includes a wire bonding zone 28 for receiving one end of a lead wire (not shown) bonded thereto.

In the embodiment of FIGS. 2A and 2B, the physical damage and contamination of wire bonding zone 28 is substantially reduced by forming an opening 29 in heat block 26 directly above each of the wire bonding zones 28. Opening 29 substantially reduces the amount of contact that heat block 26 makes with recessed area 27 on each of the leads 22. This uncontacted area of lead 22 generally coincides with wire bonding zone 28 and substantially reduces the physical damage to wire bonding zone 28.

This particular embodiment has two limitations that effect the operation and the results. First, residue from tape 25, including adhesive, tends to accumulate in openings 29 causing some foreign matter defects on wire bonding zones 28. This can be reduced somewhat with a regular cleaning program. Second, difficulties were experienced in maintaining alignment of heat block 26 on the tips of leads 22 and more specifically on wire bonding zones 28. Generally, leadframe 21 is quite small, with recessed areas 27 being approximately 0.050 inches long and opening 29 being approximately 0.025 inches long. Further, the position of wire bonding zone 28 is relatively critical because the automatic wire bonding machines utilized to bond the leads between the semiconductor die and wire bonding zones 28 must be set very accurately. Since, in some embodiments, there are twenty eight to sixty eight leads 22 on each lead frame 21, it can easily be seen why an alignment problem can occur.

Referring specifically to FIGS. 3A and 3B, a leadframe/heatspreader assembly 30 is illustrated which is a preferred embodiment of the present invention. Assembly 30 includes a leadframe 31 partially broken away and illustrating lead 32, a heatspreader 33 and adhesive tape 35. A heat block 36 is illustrated applying heat and pressure to assembly 30. Heat block 36 engages lead 32 adjacent the end thereof on either side of a recessed area 37, which includes a wire bonding zone 38 for receiving one end of a lead wire (not shown) bonded thereto.

In this embodiment recessed area 37 begins approximately 0.040 inches from the end of lead 32 and ends approximately 0.010 inches from the end of lead 32. Thus, the upper surface of leadframe 31 lies in a single plane, except for recessed portions 37, and heat block 36 contacts leadframe 31 at the single plane, rather than in the recessed portion. Because heat block 36 does not contact leadframe 31 in the recessed portions (as in FIGS. 1A and 2A) alignment of heat block 36 with leadframe 31 is not a problem. Further, the lower, leadframe contacting surface of heat block 36 is smooth and accumulation of tape residue is a minimum. Also, the position of recessed area 37 is very accurately controlled during the manufacture of leadframe 31 and, since entire recessed area 37 is not contacted by heat block 36, wire bonds can be made to any portion of recessed area 37, thereby, providing for tolerances in wire bonding machines, etc.

Referring specifically to FIGS. 4A through 4E, leadframes 31, tape 35 and heatspreaders 33 are illustrated approximately full sized and in various stages of assembly. Generally, leadframes 31 are manufactured in continuous strips or with a plurality of leadframes connected by-tie bars, a flag area and a surrounding framework of material. FIG. 4A illustrates three leadframes 31 connected together in a continuous strip. Additional leadframes 31 have been broken away. FIG. 4B illustrates the same three leadframes 31 with tie-bars and flags removed. In FIG. 4C pieces of tape 35 have been temporarily pressed into position on the lower surface (upper surface in FIG. 4C) of each leadframe 31. Tape 35 is a polyimide dielectric tape approximately 2 mils thick with approximately 0.8 mils of heat activated adhesive on opposed surfaces thereof. Tape 35 is not tacky at room temperature.

FIG. 4D illustrates three heatspreaders 33 ready to be positioned on leadframes 31. FIG. 4E illustrates three complete assemblies 30 with heatspreaders 33 positioned over the tips of leads 31 and the flag area of each of leadframes 31. Once heatspreader 33 is properly positioned to sandwich tape 35 between it and leadframe 31, heat block 36 presses the assembly together. During the pressing step of the assembly, heat block 36 is heated to approximately 250 degrees Centigrade for approximately three seconds. When heat block 36 is removed, leadframe 31 and heatspreader 33 are firmly bonded together by tape 35. Thus, assembly 30 is completed without contacting wire bonding areas 38.

Figure 5:
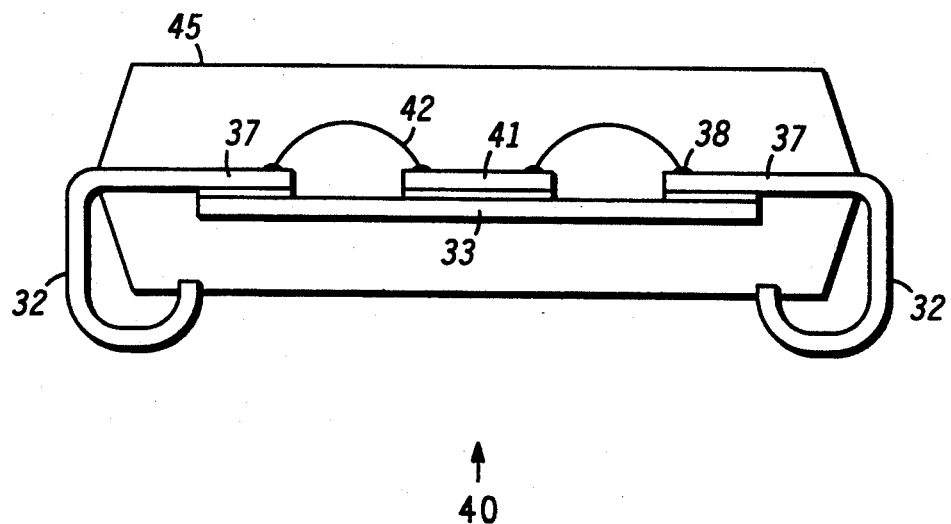
FIG. 5 is a view in cross-section of a complete semiconductor package including the assembly of FIG. 3A.

FIG. 5 illustrates a complete semiconductor package 40 including assembly 30. A semiconductor die 41 is bonded to heatspreader 33 in the flag area of the leadframe between the ends of leads 32. The various bonding pads of semiconductor die 41 are connected to appropriate ones of leads 32 by means of wire leads 42 in the usual manner. Wire leads 42 are bonded to leads 32 in wire bonding zones 38 after the construction of assembly 30. The entire assembly is then sealed in a plastic body 45 to complete semiconductor package 40.

Specific configurations and dimensions have been utilized in this description for convenience of explanation. It will be understood by those skilled in the art that these configurations and dimensions can be altered to conform to various applications of the present invention. Further, while a specific adhesive tape is described it will be understood that other adhesive material might be utilized including, for example, pressure sensitive adhesive and other base films besides polyimide might be utilized.

A new and improved leadframe has been disclosed in which the wire bonding zones are recessed from the single plane of the upper surface so that no contact is made with the wire bonding zones during the assembly of the heatspreader onto the leadframe. Also, leads coined in the manner described under this invention have the benefit of a wire bond surface protected from the contact of another leadframe stacked on it as, for example, during shipping. The recessed area allows for effective pressure on the leadframe and heatspreader assembly without contacting the wire bonding zone. Further, because the heat block has a flat leadframe contacting surface, there is no accumulation of tape residue and other foreign materials thereon. Also, no complicated modifications need to be made to the heat block and alignment of the heat block with the leadframe/heatspreader assembly is relatively easy. This invention applies to any semiconductor package with coined leads.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of constructing a heatspreader and leadframe package with non-contact leads comprising the steps of:

providing a leadframe defining a semiconductor chip receiving area and including a plurality of non-contact leads each having a wire bonding zone defined thereon for having bonded thereto one end of wires connected to a semiconductor chip, said leadframe having a first surface lying substantially in a single plane and said wire bonding zones being defined in the first surface and recessed from the single plane, and said leadframe having a second surface opposite and substantially parallel with the first surface;

providing a dielectric tape having two opposite sides with heat activated adhesive thereon;

positioning the dielectric adjacent the second surface of the leadframe, in underlying relationship to at least the wire bonding zones;

providing a heatspreader having a substantially planar surface with an area at least coextensive with the semiconductor chip receiving area and the wire bonding zones of the leadframe;

positioning the adhesive tape in overlying relationship on the heatspreader so that the semiconductor chip receiving area and wire bonding zones of the leadframe are in overlying relationship to the heatspreader and positioned on the opposite side of the adhesive tape from the heatspreader; and pressing the leadframe, adhesive tape and heatspreader together and heating the tape to form an integral unit without contacting the wire bonding zones.

2. A method of constructing a heatspreader and leadframe package with non-contact leads comprising the steps of:

providing a leadframe defining a semiconductor chip receiving area and including a plurality of non-contact leads each having a wire bonding zone defined thereon for having bonded thereto one end of wires connected to a semiconductor chip, said leadframe having a first surface defining said wire bonding zones and a second surface opposite and substantially parallel with the first surface;

providing a dielectric tape having two opposite sides with heat activated adhesive thereon;

positioning the dielectric tape adjacent the second surfaceof the leadframe, in underlying relationship to at least the wire bonding zones;

providing a heatspreader having a substantially planar surface with an area at least coextensive with the semiconductor chip receiving area and the wire bonding zones of the leadframe;

positioning the adhesive tape in overlying relationship on the heatspreader so that the semiconductor chip receiving area and wire bonding zones of the leadframe are in overlying relationship to the heatspreader and positioned on the opposite side of the adhesive tape from the heatspreader; and pressing the leadframe, adhesive tape and heatspreader together and heating the tape to form an integral unit without contacting the wire bonding zones.

3. A method of constructing a heatspreader and leadframe with non-contact leads as claimed in claim 2 wherein the step of providing a leadframe includes providing a leadframe in which the wire bonding zones are recessed from the single plane of the first side.

4. A non-contact lead design for semiconductor packages comprising a leadframe including a plurality of leads each having a wire connecting end with a wire bonding zone defined thereon for having bonded thereto one end of a wire, the other end of which is connected to a semiconductor chip, each of said wire connecting ends of said plurality of leads having a first surface lying substantially in a single plane with said wire bonding zones being recessed from the first surface and defined on at least two opposed sides by the first surface, and a second surface opposite the wire bonding zone and the two opposed sides thereof, the second surface being adapted to be secured to a planar surface of a heatspreader.

5. A semiconductor package comprising:

a leadframe including a plurality of leads each having a wire connecting end with a wire bonding zone defined thereon for having bonded thereto one end of a wire, the other end of which is connected to a semiconductor chip, each of said wire connecting ends of said plurality of leads having a first surface lying substantially in a single plane with said wire bonding zone being recessed from the first surface and defined on at least two opposed sides by the first surface, and a second surface opposite the wire bonding zone and the two opposed sides thereof;

a heatspreader having a substantially planar surface affixed to the second surface of said plurality of leads of said leadframe opposite the wire bonding zones; and a semiconductor die affixed to the planar surface of said heatspreader, said semiconductor die having a plurality of connecting pads each wire bonded to one of the wire bonding zones of the leadframe.

6. A semiconductor package as claimed in claim 5 wherein the substantially planar surface of said heatspreader is affixed to the second surface of said leads of said leadframe by means of a dielectric tape having an adhesive on both sides thereof, said tape being heat conductive.

* * * * *